United States Patent [19]

Furnival

[11] Patent Number: 5,408,128

[45] Date of Patent: Apr. 18, 1995

[54] HIGH POWER SEMICONDUCTOR DEVICE MODULE WITH LOW THERMAL RESISTANCE AND SIMPLIFIED MANUFACTURING

[75] Inventor: Courtney Furnival, Temecula, Calif.

[73] Assignee: International Rectifier Corporation, El Segundo, Calif.

[21] Appl. No.: 122,052

[22] Filed: Sep. 15, 1993

[51] Int. Cl.⁶ .................... H01L 23/48; H01L 29/40
[52] U.S. Cl. ................................. 257/690; 257/694; 257/698; 257/724
[58] Field of Search .................... 257/690, 692–694, 257/712, 713, 717, 723, 724, 698

[56] References Cited

U.S. PATENT DOCUMENTS

| 4,510,677 | 4/1985 | Collumeau | 257/690 |
| 5,105,259 | 4/1992 | McShane et al. | 257/667 |
| 5,291,065 | 3/1994 | Arai et al. | 257/723 |

FOREIGN PATENT DOCUMENTS

| 3336979 | 4/1984 | Germany | 257/723 |
| 0103649 | 6/1985 | Japan | 257/717 |
| 0250164 | 10/1988 | Japan | 257/724 |

Primary Examiner—Robert P. Limanek
Assistant Examiner—Peter Toby Brown
Attorney, Agent, or Firm—Ostrolenk, Faber, Gerb & Soffen

[57] ABSTRACT

A high power semiconductor module has an IMS substrate which carries the semiconductor die to be interconnected within the housing. A terminal board carries the terminals for connection to the substrate with a snap connection, with the terminals positioned above respective solder pads on the IMS board. Integral breakaway pins on the terminal board position the board relative to the IMS during soldering. A central opening in the terminal board allows the loading of a soft silicone into the space between the IMS substrate and bottom of the terminal board. The terminal board has bosses extending upwardly over its top surface adjacent each power terminal, and the bottom of a top housing assembly has ribs which enclose the bosses on the top of the terminal board. A silicone glue is poured onto the top of the terminal board and into the spaces between and around the bosses. The ribs project into this glue to provide a good insulation seal around the power terminals projecting through the terminal board.

24 Claims, 7 Drawing Sheets

FIG. 1
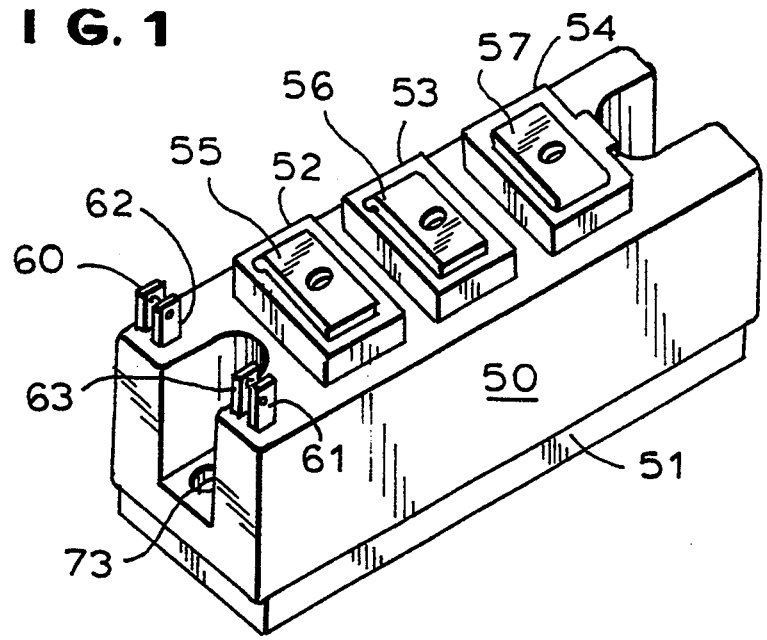
FIG. 2
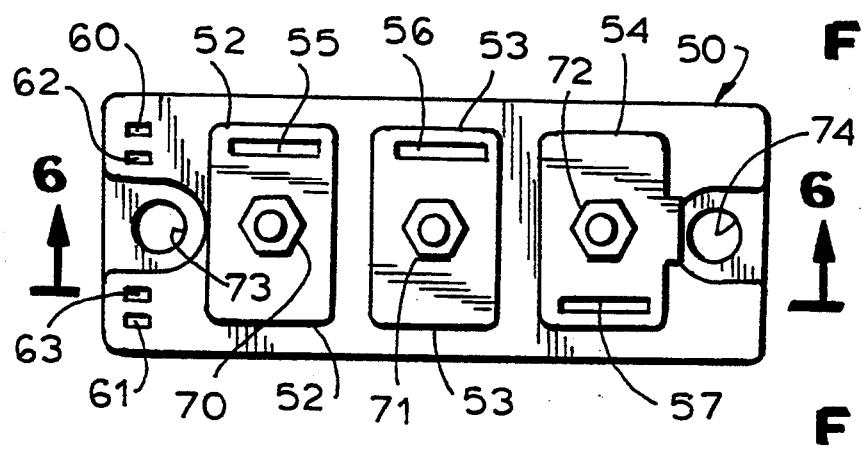
FIG. 3
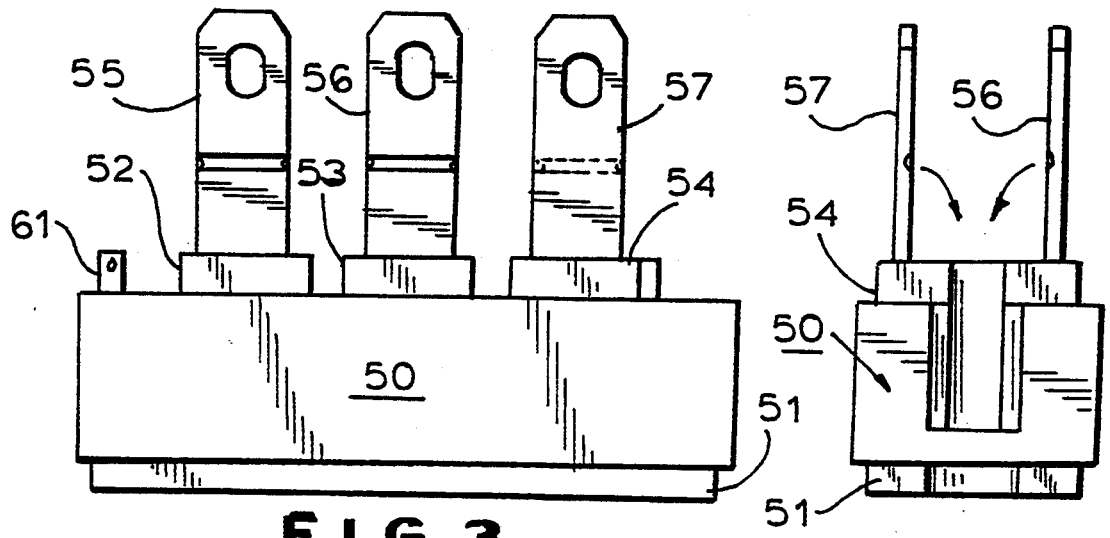
FIG. 4

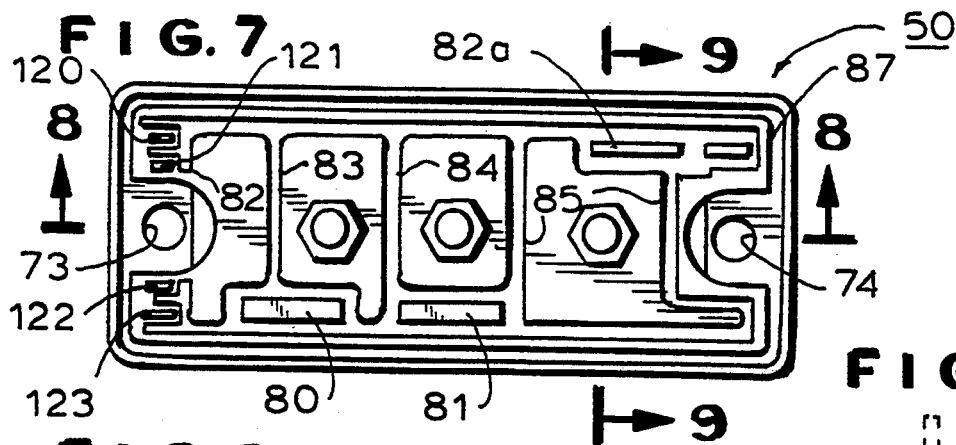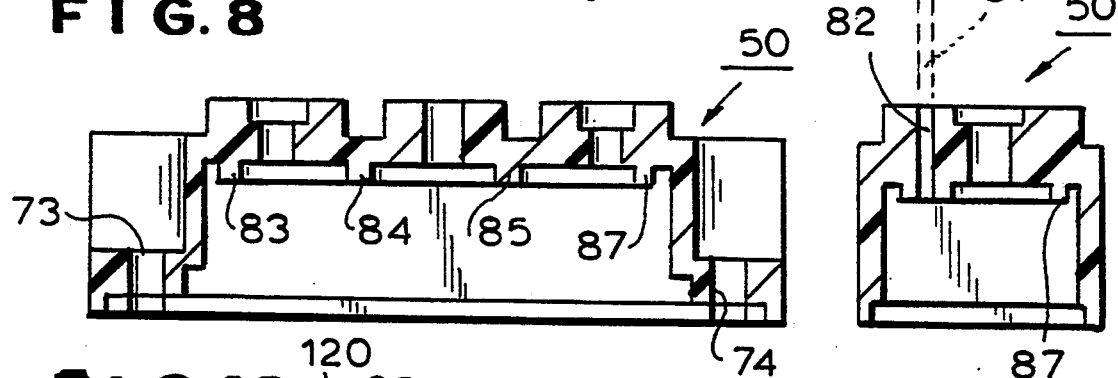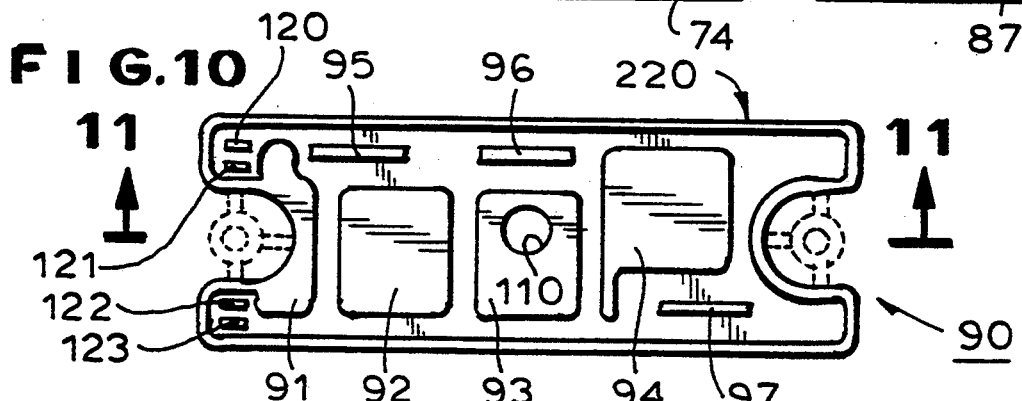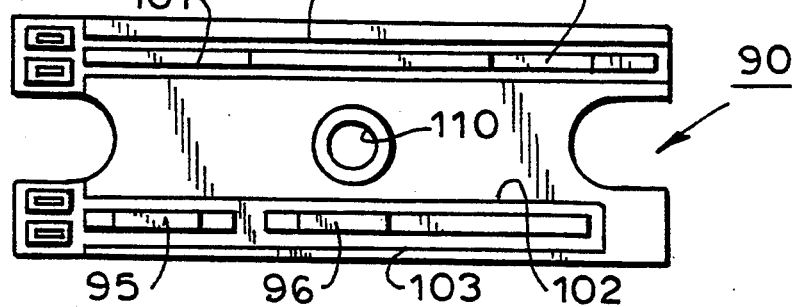

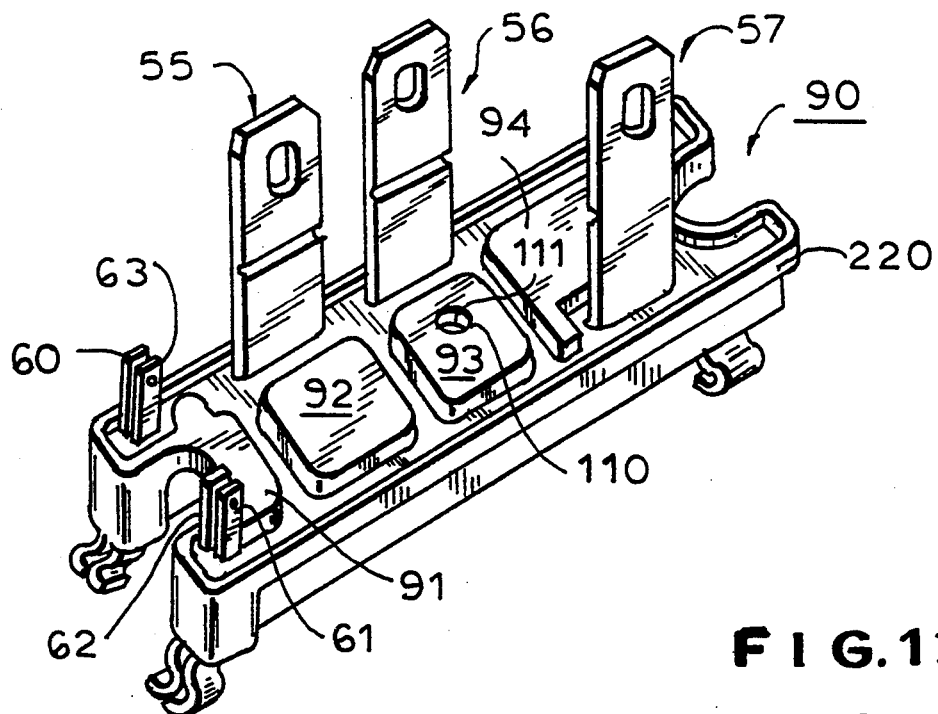
FIG. 22
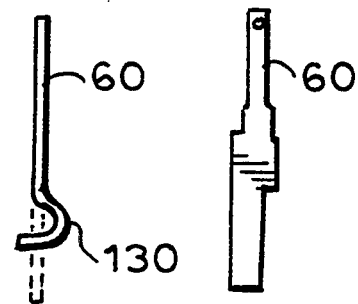
FIG. 13
FIG. 14
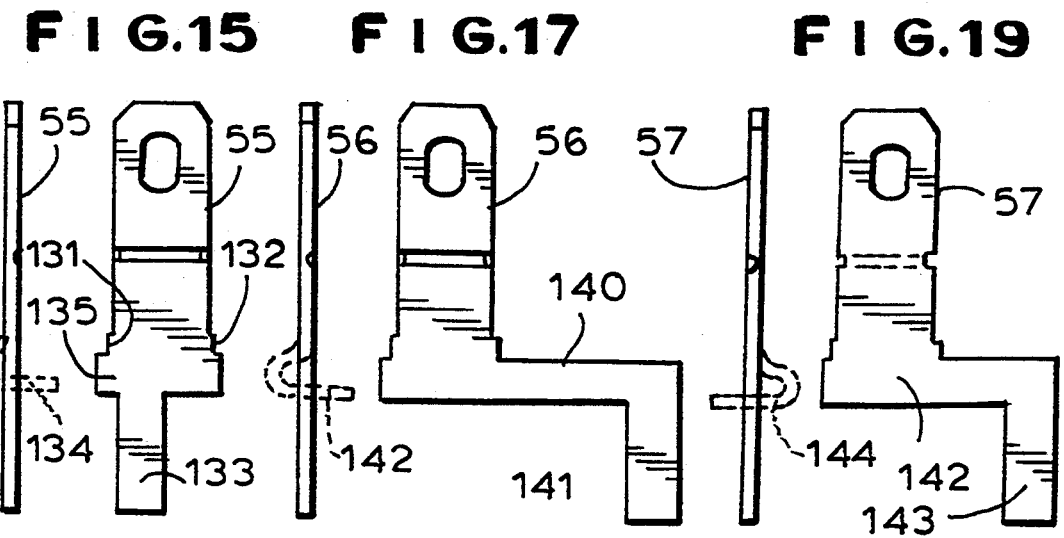
FIG. 15   FIG. 17   FIG. 19
FIG. 16   FIG. 18   FIG. 20

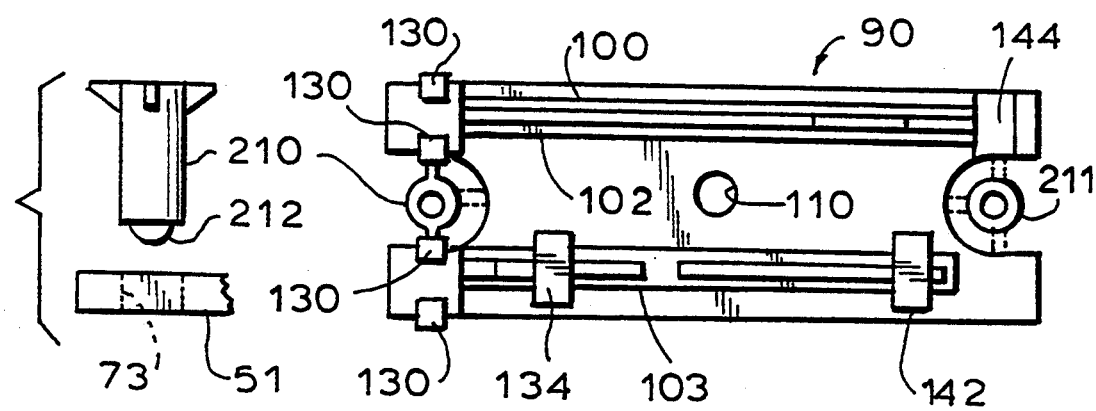
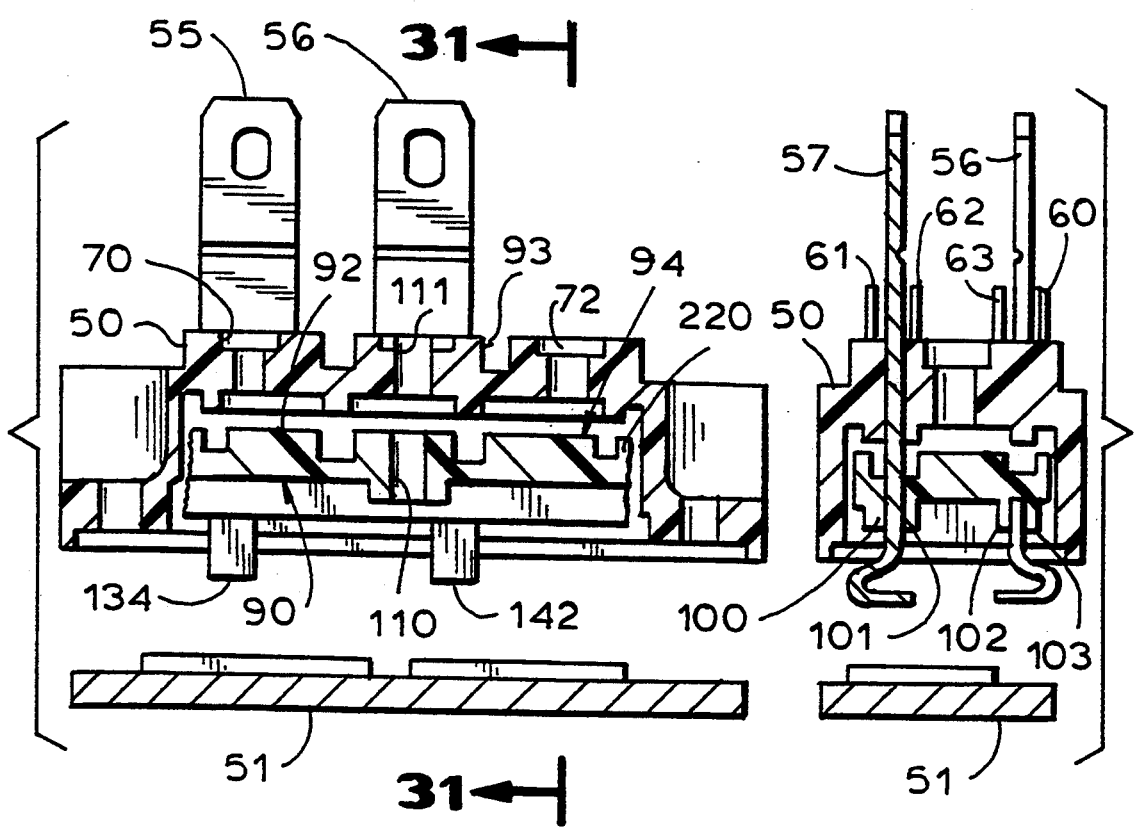

HIGH POWER SEMICONDUCTOR DEVICE MODULE WITH LOW THERMAL RESISTANCE AND SIMPLIFIED MANUFACTURING

BACKGROUND OF THE INVENTION

This invention relates to a novel module housing for semiconductor devices, and more specifically relates to a novel module structure employing a full IMS (insulated metal substrate) within a novel housing structure which ensures full electrical insulation of all parts in a novel and reliable manner.

Semiconductor device modules are well known, and are generally employed for housing a plurality of interconnected semiconductor chips. The chips may be of the same or diverse kinds and are mounted on a heat sink within a common housing having terminal electrodes extending therefrom. For example, semiconductor modules can provide a housing for electrically interconnected diodes, MOSFETs, IGBTs or bipolar transistors which are connected in various kinds of preselected circuits, such as half bridges, full wave bridges, voltage doublers and the like. Relatively massive terminals extend from the insulation housing for electrical connection by the user. The present invention provides a module structure having improved thermal management and ease of manufacture and improved reliability.

BRIEF SUMMARY OF THE INVENTION

The module of the present invention is built on an IMS substrate which has semiconductor chips or die thermally secured thereto Hereinafter the terms "chip", "die" and "wafer" are interchangeably used to indicate a bare, thin, flat semiconductor body having electrodes on its opposite surface. The semiconductor device can be of any desired type, such as a diode, power MOS-gated device such as a MOSFET, IGBT, MOS-controlled thyristor, or the like.

The IMS substrate has a relatively thick aluminum body covered by a very thin insulation layer which, in turn, carries a copper pattern which is electrically insulated from the aluminum. The die are mounted on one or more heat spreaders at central regions of the heat spreader to improve thermal management of the heat generated by the die during operation of the device.

The IMS substrate also has patterns for conveniently receiving bonding wires and the main device terminals. Thus, the die are internally interconnected with one another on the IMS substrate by stitch-bonding of parallel lead wires. These wires are ultimately connected to a vertical terminal which extends externally of the housing.

In accordance with an important feature of the invention, the terminals of the device are carried in a molded insulation terminal board and are snap-connected through slots in the board to simplify assembly of the device. Each terminal has a reentrantly bent end portion to act as a flat terminal extension which can be conveniently soldered to suitably located solder pads on the IMS substrate. The terminals are pre-positioned relative to the IMS substrate and end in a common plane so that they can be directly soldered down during assembly.

A novel positioning fixture is created by the terminal board by providing breakaway pins at the opposite ends of the terminal board which are located in the mounting openings of the IMS substrate during assembly. The pins are broken away after the main terminals have been soldered to the IMS substrate.

In accordance with a further feature of the invention, a space is left between the bottom of the terminal board and the top of the IMS which acts as an expansion space for a soft silicone filler which can be loaded into the space through an opening in the terminal board after the solder-down operation is completed and before a top cap is assembled on the module. After filling, the space is sealed off by sealing a single central filling opening in the terminal board.

As a still further feature of the invention, the upper surface of the terminal board is provided with extending bosses through which the terminals extend. The interior of the top cap is provided with integral ribs which nest into and surround the bosses on the terminal board when the two parts are assembled. Prior to the assembly of the top cap, the entire upper surface of the terminal board is filled with a suitable adhesive or glue so that, when the top cap is assembled in place, all the spaces surrounding the terminals are sealed by the glue to prevent the seepage of air or contaminants into the interior of the housing and into and between the various terminal leads which could lead to short-circuiting of the main terminals.

Other features and advantages of the present invention will become apparent from the following description of the invention which refers to the accompanying drawings.

BRIEF DESCRIPTION OF THE DRAWINGS

FIG. 1 is a perspective view of a housing constructed in accordance with the present invention.

FIG. 2 is a top view of the housing of FIG. 1.

FIG. 3 is an elevational view of the top view of FIG. 2.

FIG. 4 is a side view of FIG. 3.

FIG. 7 is an interior view, looking into the interior of the top cap of the assembly of FIGS. 1 through 4 and 6.

FIG. 8 is a cross-sectional view of FIG. 7 taken across the section line 8—8 in FIG. 7.

FIG. 9 is a cross-sectional view of FIG. 7 taken across the section line 8—8 in FIG. 7.

FIG. 10 is a top view of the terminal board structure of preceding figures.

FIG. 11 is a cross-sectional view of FIG. 10 taken across the section line 11—11 in FIG. 10.

FIG. 12 is a bottom view of FIG. 11 as seen from the section line 12—12.

FIG. 13 is an elevation view of a gate contact for one of the control terminals for the housing of the preceding figures.

FIG. 14 is a side view of the terminal of FIG. 13 after its bottom is bent into soldering position.

FIG. 15 is an elevational view of one of the main terminals of the assembly of FIG. 1.

FIG. 16 shows a side view of the terminal of FIG. 15 showing, in phantom, the terminal bent into position for soldering.

FIG. 17 shows a second of the main terminals of the assembly of FIG. 1 in elevation view.

FIG. 18 is a side view of the terminal of FIG. 17.

FIG. 19 is an elevational view of a third of the main terminals of the assembly of the invention.

FIG. 20 is a side view of the terminal of FIG. 19.

FIG. 22 shows the terminal board of FIG. 21 with the terminals snapped into position and retained by the board.

FIG. 28 is a bottom view of the terminal board of FIG. 22 and shows the location of the main terminal solder pads or bottoms, such that they are located at the terminal positions in FIG. 27, and further show, in phantom view, breakaway positioning projections which assist in positioning the terminal board and terminals relative to the IMS during the solder operation.

FIG. 29 shows one of the breakaway elements of FIG. 28 positioned relative to the mounting opening in the IMS substrate.

FIG. 30 is a cross-sectional view schematically illustrating the top cap, terminal board and IMS substrate located relative to one another just prior to full assembly of these components.

FIG. 31 is a cross-sectional view of FIG. 30 taken across the section line 31—31.

DETAILED DESCRIPTION OF THE DRAWINGS

Figure 5:
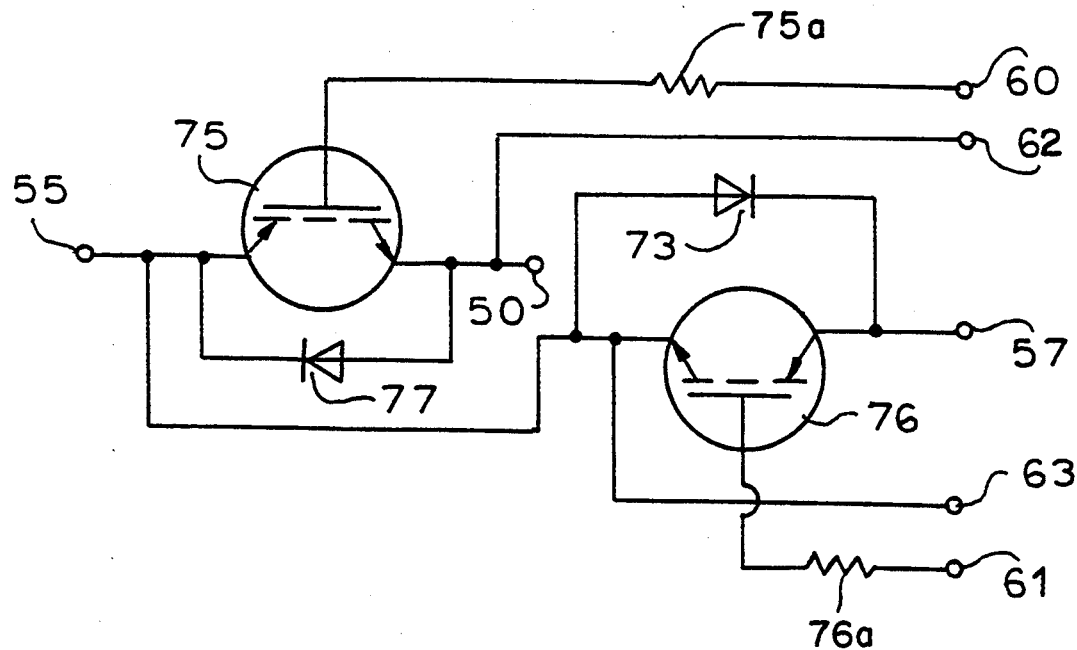
FIG. 5 is a circuit diagram of the internal circuit formed within housing of FIGS. 1 to 4.

Referring first to FIGS. 1 to 4, there is shown therein a novel module structure consisting of an insulation molded cap 50 which is secured to an IMS substrate 51, each of which will be described in more detail hereinafter.

Cap 50 has three projecting bosses 52, 53 and 54 extending from its upper surface which contain downwardly bent segments of the three main terminals of devices 55, 56 and 57. Also shown in FIG. 1 are the two control terminals 60 and 61 and two auxiliary power terminals 62 and 63.

As shown in FIGS. 2, 3 and 4, when the subassembly is assembled and before it is placed in use, the terminals 55, 56 and 57 extend upwardly and expose hexagonal nut-receiving openings 70, 71 and 72 (FIG. 2) which are covered when the ends of terminals 55, 56 and 57 are pressed downwardly. These openings may receive a hexagonal nut conventionally used for the connection of electrical terminals to the housing.

The IMS substrate 51 is also provided, as shown in FIG. 2, with mounting openings 73 and 74 which permit the bolting of the IMS substrate and the assembly to a heat sink. The circuit formed by the device to be described is a one-half bridge formed of IGBTs 75 and 76 (insulated gate bipolar transistors) schematically shown in FIG. 5. IGBTs 75 and 76 are connected in parallel circuit relationship with respective fast recovery diodes 77 and 78. The electrical terminals of the half-bridge circuit shown in FIG. 5 correspond to those previously designated in FIG. 1. Substrate 51 is best shown in FIG. 6 as having a central insulation layer 51a which insulates the upper and lower conductive halves of substrate 51.

Figure 6:
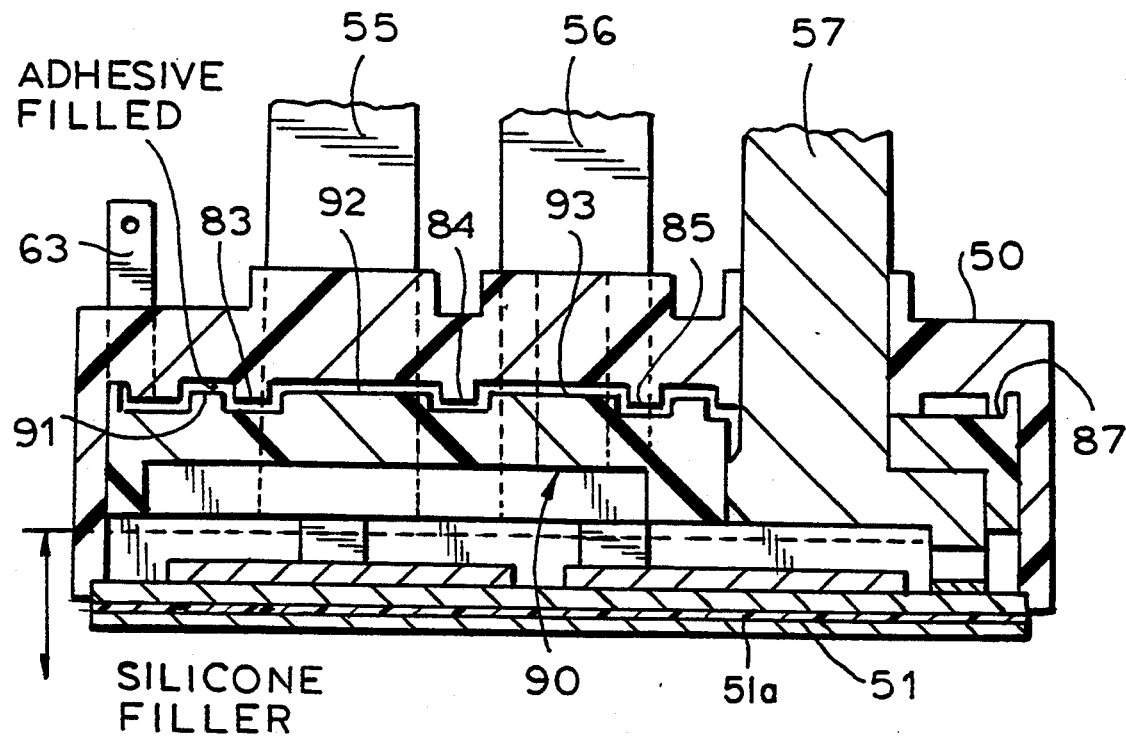
FIG. 6 is a cross-sectional view of FIG. 2 taken across the section lines 6—6 in FIG. 2.

It should be noted that numerous types of circuits other than that shown in FIG. 5 can be used with the housing of the invention, for example, single and three-phase full-wave bridges, voltage doublers, and the like. Various kinds of semiconductor die, such as diodes, thyristors, bipolar and MOS transistors can be arranged singly or in parallel. As will be later described, the IGBTs 75 and 76 consist of four parallel-connected chips.

The outer housing or cap 50 is shown in more detail in FIGS. 7, 8 and 9. Thus, the interior of the cap contains openings 80, 81 and 82a through which terminals 55, 56 and 57 may extend in the assembled device. Openings 80, 81 and 82a are shown as surrounded by ridges which extend downwardly from the interior of the housing. Other extending ridges, shown in FIGS. 7, 8 and 9 variously as the ridges 82, 83, 84, 85 and 86, cooperate with a main internal elongated ridge 87 which extends around the entire interior of the cap 50. When cap 50 is placed over the interior terminal board, to be later described, annular isolation spaces enclose each of the terminals which can be filled with a silicone gel or the like in order to insulate the terminals from one another in a sure and easy manner.

There is next described the novel terminal board structure 90 of the invention which is adapted to carry the main terminals 55, 56 and 57 and control terminals 60 through 63 in a snap-in manner. The 10 terminal board 90 is shown in FIGS. 6, 10, 11, 12, 21, 22 and 28. Terminal board 90 is a molded plastic body having a plurality of spaced bosses 91 through 94 on its upper surface. These bosses, as will later be shown, nest within and are surrounded by projecting ribs on the interior of the upper cap 50. The volume between and surrounding the bosses may be filled with a silicone glue adhesive, as shown in FIG. 6, before the top cap 50 is assembled onto the terminal board 90. The ribs of top cap 50 project into the adhesive and, when the adhesive sets, the terminals are well sealed against leakage paths between terminals.

Figure 21:
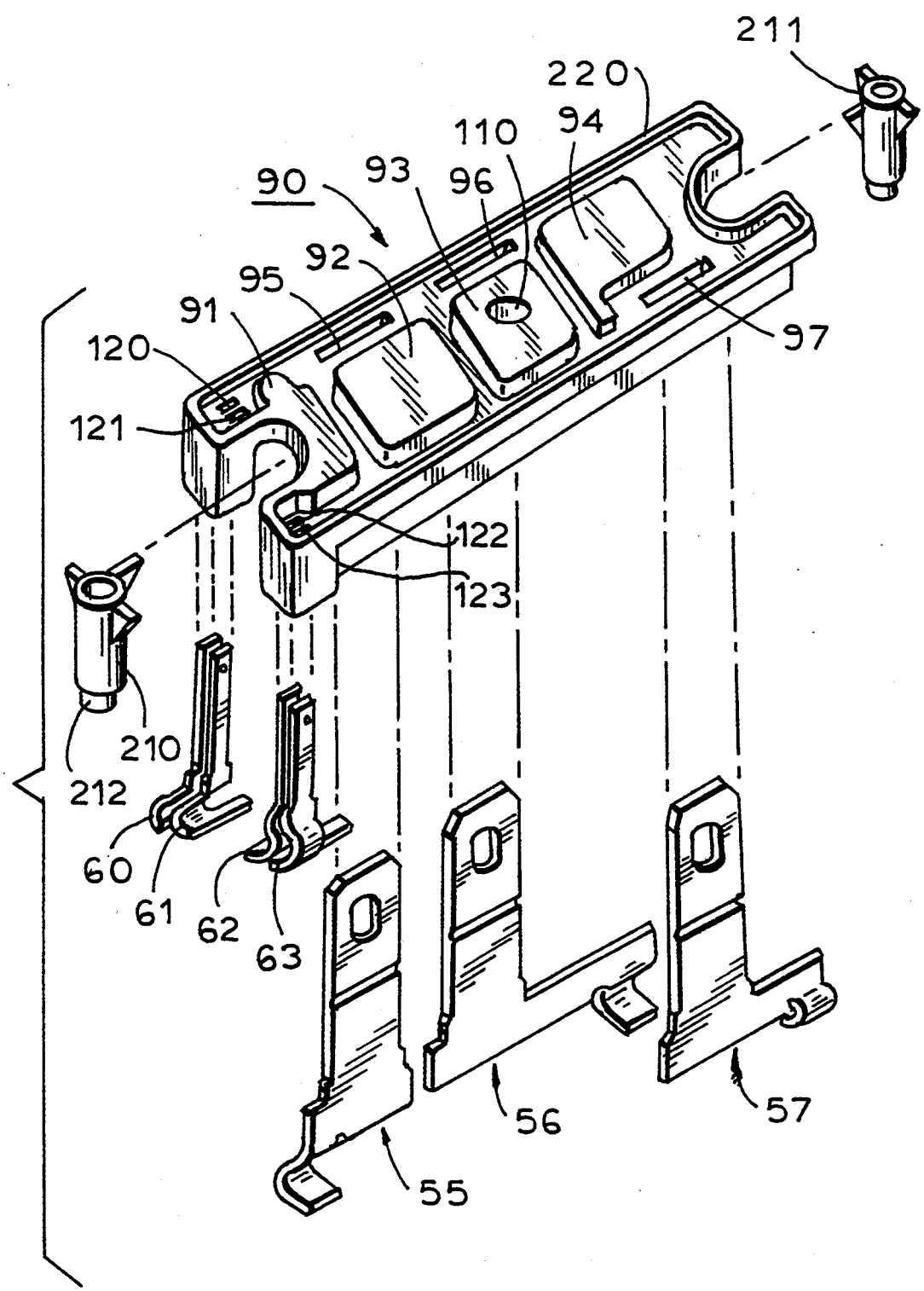
FIG. 21 is an exploded perspective of the terminal board of FIG. 10 with the various terminals of FIGS. 13 to 20 positioned for insertion into the terminal board.

Terminal board 90 is also provided with elongated slots 95, 96 and 97 through which the terminals 55, 56 and 57 may extend and be captured, as will be later described and as shown in FIGS. 21 and 22. In the underside of the terminal board there are elongated integral plastic skirts 100–101 extending along the bottom length of the terminal board on opposite sides of slot 97. Similar elongated skirt members 102 and 103 extend on opposite sides of slots 95 and 96. The space between skirts 100–101 and 102–103 receives extensions of the terminals 55, 56 and 57 to enable good snap-in connection and firm securement of the terminal to the terminal board as will be later described and also isolates the terminals in the expansion cavity.

Also provided in the terminal board 90 is a through-opening 110. As will be later described, this opening 110 permits filling of the space between the IMS member 51 and the bottom of the terminal board with a soft silicone which has a high expansion coefficient before the assembly of the top cap. A plastic plug or stopper of ball shape 11 (FIG. 22) can be pressed into opening 110 after the filling operation, and can be glued in place to seal the chamber.

The terminal board 90 has four parallel spaced openings 120–123 (FIG. 10) which receive the terminals 60, 62, 63 and 61, respectively, for the device. These terminals are force-fitted into the terminal board and are carried thereby as a subassembly along with the main terminals 55, 56 and 57.

While the various terminals can have any desired configuration, FIGS. 13 to 20 show the configuration used in the preferred embodiment of the present invention. Thus, all of terminals 60 to 63 have the structure of terminal 60 shown in FIGS. 13 and 14. Terminals 60 to 63 are simply pressed into the openings 120 through 123 and may be held therein by force-fitting due to bowing or tapering surfaces which press forcefully into the opposing side of the slots to hold the terminals in position. Note that the bottom of the terminal 60 is rolled upwardly at its bottom 130 in FIG. 14 to provide a flat that can be soldered to an appropriate area on the IMS substrate 51, as will be later described.

The terminal 55 has the configuration shown in FIGS. 15 and 16, and it will be noted that the terminal is provided with the tapered surfaces 131 and 132 which are dimensioned to "bite" into the opposite ends of the slot 95 which receives the terminal 55 in order to frictionally hold it in position within the terminal board after it is inserted therein.

As shown in FIG. 16 in dotted lines, the projecting end section 133 of the terminal can be rolled upwardly, as shown in dotted lines in FIG. 16, to form the flat terminal bottom portion 134 which can be soldered to a suitable pad on the IMS substrate 51, as will be later described. Note that the body portion 135 of the terminal will fit between the skirts 102 and 103 in FIG. 12 when the terminal 55 is inserted into the terminal board.

FIGS. 17 and 18 show the terminal 56 which has an elongated body 140 and a downwardly projecting terminal section 141 which can be rolled to the shape 142, shown in FIG. 18, which has a bottom flat which can be soldered down to the IMS substrate.

FIGS. 19 and 20 show the terminal 57 which has a body portion 142a and terminal extension 143 which can be rolled to the dotted line shape 144 shown in FIG. 20. When terminal 57 is loaded into the terminal board, it will be pressed into the slot 97 and held therein by friction, with the terminal end 144 projecting outwardly and downwardly.

All terminals are slidably loaded into the terminal board 90, as shown in FIGS. 21 and 22, and are fixed within terminal board 90 by friction or snap action. The bottoms 130 for each of the control terminals and bottoms 134, 142 and 144 for terminals 55, 56 and 57 lie in a common plane after the assembly of the terminals in board 90. These bottom surfaces will be soldered to appropriate solder pads which are suitably located on the IMS substrate 51 as will be next described.

Figure 23:
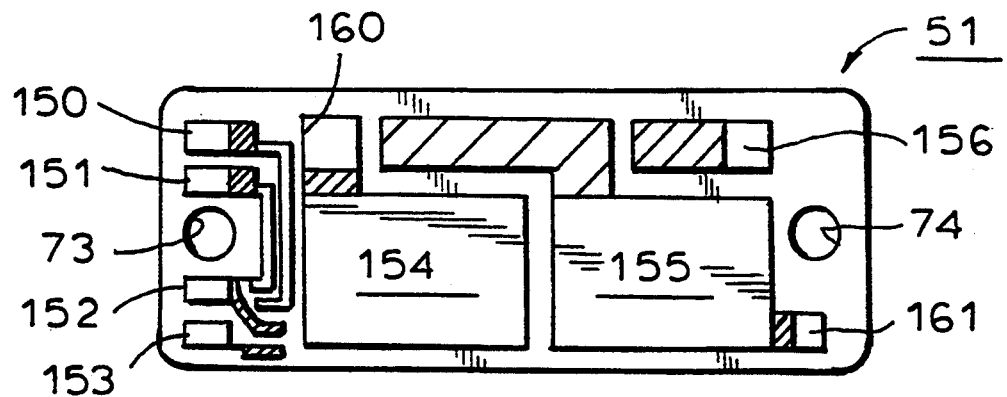
FIG. 23 is a top view of the IMS substrate used in accordance with the invention before mounting thereon of heat spreaders and leads.
Figure 24:
FIG. 24 is a side view of FIG. 23.

The substrate 51, without die attached, is shown in FIGS. 23 and 24. The substrate 51 is basically a thick plate of aluminum having a thin insulation layer on its top. A copper pattern is formed on the top of the insulation layer. IMS substrates are well known. Since the insulation layer is extremely thin, it permits good heat transfer from the copper traces to the main aluminum substrate while providing good electrical insulation between the two.

FIG. 23 shows copper areas 150 through 156 atop the IMS substrate which are insulated from the aluminum substrate and from one another. Where these copper areas are shown with hatching, the hatching is intended to represent clad aluminum which permits the formation of an ultrasonic bond to a lead wire. The copper areas which are unplated are suitable for soldering to other components.

Figures 25, 26:
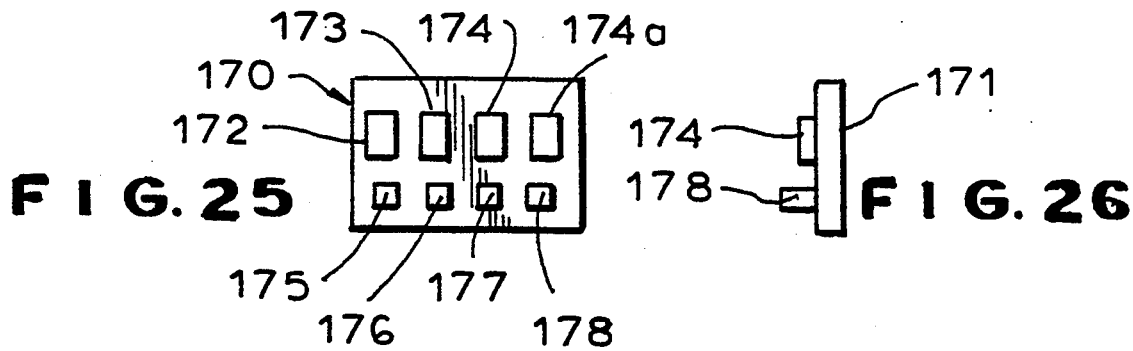
FIG. 25 is a top view of a heat spreader having selected IGBT an fast recovery die soldered thereto.
FIG. 26 is a side view of the heat spreader of FIG. 25.

Enlarged areas 154 and 155 each contain extensions 160 and 161 which are adapted to accept heat spreaders, such as the heat spreader 170 of FIGS. 25 and 26, which may be an aluminum plate which has soldered thereto the various die which are employed to create the semiconductor circuit for the module. In the case of the spreader 170 of FIGS. 25 and 26, there are soldered thereto four parallel-connected IGBT die 172 through 174 and 174a and fast recovery diodes 175 through 178, all parallel-connected. These components correspond generally to the IGBT 75 and fast recovery diode 77 of FIG. 5.

Figure 27:
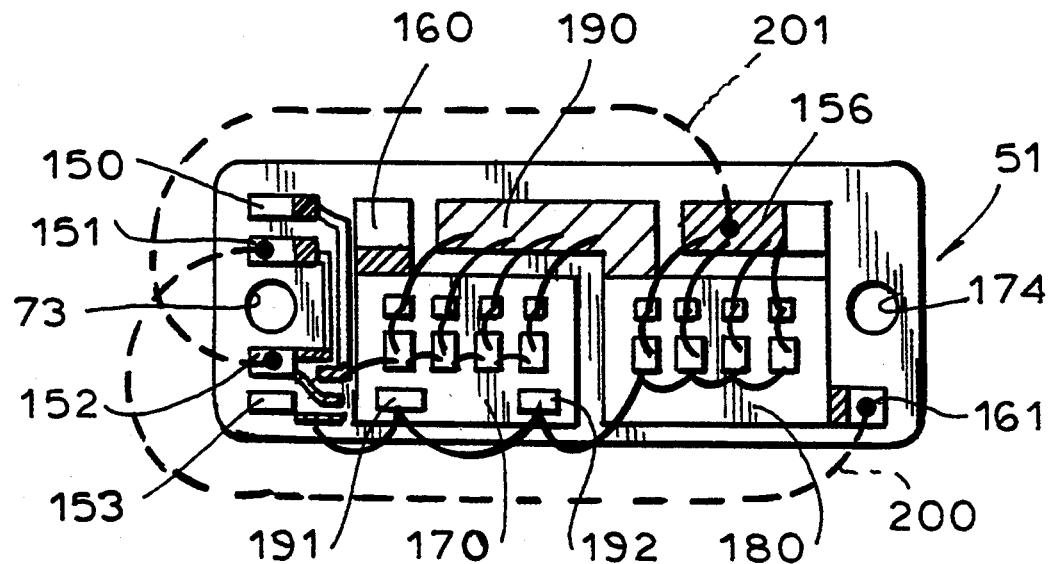
FIG. 27 is a top view of the IMS substrate of FIG. 23 after the heat spreaders have been soldered in position on the IMS substrate and leads have been interconnected between the various die and terminals.

Two such assemblies on respective heat spreaders are used as is shown in FIG. 27, where the spreader 170 is that shown in FIGS. 25 and 26 while an identical assembly 180, corresponding to IGBT 76 and diode 78 in FIG. 5, is soldered to copper area 155 in FIG. 27.

The back surface of each die is soldered down to its respective heat spreader 170 and 180 while the terminals on the upper surfaces of the die are ultrasonically bonded using appropriate wire and stitch-bonding, as is well known. Only a single stitch-bond wire is shown in FIG. 27 although, in practice, four parallel stitch-bonds are used for each connection.

In FIG. 27, control terminal 150 is connected via a trace on the IMS to the gate contacts of each of the IGBT die on spreader 170. The emitter contacts of each of the die of spreader 170 are then first connected to an electrode of a respective fast recovery diode and then to the extension 190 of the trace 155. Control terminal 153 is first bonded to conductive pads 191 and 192 which are insulated (in a manner not shown) from the heat spreader 170 and are then stitch-bonded to the control electrodes of the IGBT die on the heat spreader 180.

The main electrodes on the upper surfaces of the IGBTs on heat spreader 180 are then stitch-bonded, first to a respective fast recovery diode and then to the conductive pad 156 on the IMS substrate. In order to connect control electrodes 151 and 152 to power terminals 56 and 57, insulated wires, schematically illustrated by dotted lines 200 and 201, respectively, connect these terminals to the pad extension 161 and to the pad 156.

Referring next to FIGS. 22, 27 and 28, it can be understood that the subassembly of FIG. 22, in which the various terminals are physically supported within the terminal board, can be simply applied atop the IMS surface of FIG. 27, such that contacts 134, 142 and 144 are placed over and in contact with the copper exposed portions of terminals 160, 156 and 161, respectively. The entire subassembly, including the bottoms of the control terminals 60 to 63 which will line up with areas 150 to 153, can then be soldered down as a full subassembly in a single operation.

To help locate the subassembly of FIG. 22 relative to the IMS during this solder-down operation, a pair of removable pegs may be included in the molding of the terminal board 90. Thus, as shown, for example, in FIG. 21, and in FIG. 28 in dotted lines, pegs 210 and 211 are integrally fastened to the notches in the opposite ends of board 90 and are easily broken away therefrom. These positioning pegs 210 and 211 have reduced diameter end portions, such as the end portion 212, shown in FIG. 29 for peg 210 which is adapted to closely fit in mounting opening 73 in the IMS substrate 51. In a similar manner, the opposite peg 211 will fit into the opening 74 of the IMS board 51 so that the entire subassembly in FIG. 22, including the bottoms of the terminals, will be accurately located relative to respective copper pad regions on the IMS substrate 51, so that the solder-down operation can take place.

Once the subassembled terminal board is soldered down in place, the bottom of the board is spaced above the top surface of the IMS substrate as is best shown in FIG. 6 to form an expansion space above the die and wire bonds. It is, of course, desirable to fill the area containing the die and lead wires with a passivation environment, for example, a soft silicone which is free to expand with temperature variation and to permit thermal movement of the die and bond wires, and also to fully seal the housing against the entry of moisture or contaminants, and to maintain insulation integrity between the various terminals.

In accordance with the invention, the volume contained between the bottom of terminal board 90 and the top of the IMS structure 51 is filled through the fill opening 110 in terminal board 90 with a soft silicone to a height above the height of the various die and connection bonds. A small expansion space can be left in the bottom of board 90, as is best shown in FIG. 6. FIG. 6 shows, by dotted line, the level to which the soft silicone can fill the interior volume between the top of the IMS substrate 51 and the bottom of housing 90. After filling the volume with soft silicone, the volume is sealed by plugging opening 110, as with a plastic ball 111 which is glued in place.

The top housing 50 is next mounted by sliding the terminals 55, 56 and 57 through the openings 80, 81 and 82a in the top cap until the fold lines of these terminals fit flush with the tops of the bosses 55, 56 and 57 of FIG. 1, so that the terminals can be easily folded down after assembly is completed.

In order to insulate the terminals from one another at the top of the terminal board 90, a novel structure is provided wherein the terminal board is provided with upwardly projecting bosses 91, 92, 93 and 94 which nest within or are surrounded by the extending ribs, such as the ribs 82, 83, 84, 85 and 86 and the areas enclosed thereby in the bottom of the top housing. The nesting of these regions helps to isolate the terminals from one another. Preferably, the area at the top of housing 90 and circumscribed by the ridge 220 (FIGS. 10 and 21) is filled to roughly half its height with a suitable adhesive or glue. This glue will surround the terminals 55, 56 and 57 in FIG. 2. When the top cap 50 is then assembled, the various ribs will project into the spaces defined between the bosses 91 through 94 and around these bosses and into the glue, thereby to effectively seal the terminals and to seal the entire housing against the entry of moisture therein. At the same time, a glue or adhesive can also be used to seal around the edge of the IMS substrate 51 and between that edge and the groove at the bottom of housing shown in FIG. 6. Thus, an entirely sealed housing is provided, with the terminals very well insulated from one another and with the semiconductor components within the housing securely passivated by a silicone which freely expands and contracts.

In the foregoing description of the invention, the preferred embodiment was shown with particular dimensions. It will be understood that the dimensions shown can change while still coming within the concepts of the invention. For example, the width of the device can be doubled to make room for a third and fourth heat spreader with semiconductor components which can be connected in parallel with those on heat spreaders 170 and 180. Thus, the IMS 51 would be twice as wide and all components would otherwise be made wider to fit this new dimension.

In general, the invention permits the use of the maximum size heatspreader to get the maximum thermal performance from the package. The terminal sealing approach provides a reliable seal with expansion for the silicone gel, and the molded/pre-assembled terminal board makes the package more manufacturable. These three innovations provide a full IMS package with improved performance, reliability and manufacturability.

Performance is improved by using parallel IGBT chips, to create a high current switch. The gate resistors are integrated into the chips, allowing the gates to be stitch bonded together, eliminating the IMS substrate conductor and resistor area. For example, each of the IGBTs may have resistors such as resistors 75a and 75b connected in their gate circuits, or integrated into the die so that, if IGBTs are placed in parallel, resistors need not be separately provided. This allows the heatspreaders to be enlarged to maximize the power dissipation through the epoxy insulator of the IMS substrate. Note, the IMS substrate requires and allows these large areas more than typical metal/ceramic type modules. The larger heatspreaders lower the device thermal resistance (theta-jc), and thermally coupled the individual IGBT chips for improved switching of the paralleled chips.

Reliability is improved by the silicone gel which protects the semiconductor chips from moisture and other environmental factors. In high power modules that require large copper terminals exiting the top of the package, the industry has been forced to fill, on top of the silicone gel, a relatively rigid epoxy. This confines the silicone gel, often creating rupture of the package, and associated silicone gel leakage and damage to the silicone seal. The terminal support which provides mechanical support and a sealing of the terminals, at the innovative support board to package case, allows an expansion space above the silicone gel. This expansion space prevents the expanding silicone gel from rupturing the package at high temperatures.

The molded terminal support board provides an easily manufactured, high precision carrier for the terminals, allowing them to be aligned to the substrate pattern and to the case as a single pre-assembled unit. This eliminates manufacturing fixtures and complex placement systems for solder reflow, component placement and package closure.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor module comprising: an insulation housing cap having an open bottom, a plurality of semiconductor die interconnected within said housing cap to form a predetermined electrical circuit, a planar thermally conductive substrate extending across and fixed across said open bottom of said housing cap and supporting said plurality of semiconductor die, a plurality of rigid terminals insulated from one another and extending generally perpendicularly from the plane of said thermally conductive substrate, a terminal carrier board having spaced openings therethrough which receive and are fastened to intermediate points along the lengths of said plurality of terminals for supporting said terminals in parallel spaced and insulated relationship to one another; each of said terminals having first and second end regions; said first end regions of said terminals disposed in a common plane which is generally coplanar with the top surface of said thermally conductive substrate; the top surface of said thermally conductive substrate having spaced conductive bonding areas in alignment with respective first end regions of said plurality of terminals and at which said first end regions of said terminals are mechanically fixed to selected ones of said conductive bonding areas on said thermally conductive substrate; the bottom of said terminal board being spaced above the top of said thermally conductive substrate to define a first expansion volume above said substrate; said housing cap having spaced openings therethrough at locations corresponding to the location of said plurality of terminals; said plurality of terminals extending through said openings in said housing cap to be accessible for external connection; said terminal board being nested within the interior of said housing cap.

2. The device of claim 1 wherein said plurality of terminals are snap-connected within said terminal board.

3. The device of claim 1 wherein said first volume is at least partly filled with a soft silicone filler.

4. The device of claim 3 wherein said terminal board has a sealable opening therethrough for injecting said soft silicone filler into said first volume.

5. The device of claim 1 wherein said substrate has mounting openings therethrough in areas external to said cap; said terminal board having removable projections which nest into said mounting openings to position said terminal board and the said first ends of said plurality of terminals in alignment with their said respective bonding areas on said substrate during assembly.

6. The device of claim 1 wherein said first end regions of said terminals are bent to define flat end areas which are parallel to the plane of said substrate.

7. The device of claim 1 wherein said substrate is an IMS substrate.

8. The device of claim 1 wherein the interior of said housing cap is glued to the top of said terminal board, with said glue enclosing and sealing the periphery of each of said terminals where they extend through said terminal board and said housing cap.

9. The device of claim 8 wherein said glue is a silicone glue.

10. The device of claim 8 wherein the top of said terminal board has a shallow glue-receiving moat through which said plurality of terminals extend, and wherein the interior of said housing cap has a plurality of integral projections which project into said moat and surround said terminals.

11. The device of claim 4 wherein said plurality of terminals are snap-connected within said terminal board.

12. The device of claim 4 wherein said first end regions of said terminals are bent to define flat end areas which are parallel to the plane of said substrate.

13. The device of claim 11 wherein said substrate is an IMS substrate.

14. The device of claim 12 wherein said substrate is an IMS substrate.

15. The device of claim 4 wherein the interior of said housing cap is glued to the top of said terminal board, with said glue enclosing and sealing the periphery of each of said terminals where they extend through said terminal board and said housing cap.

16. The device of claim 15 wherein the top of said terminal board has a shallow glue-receiving moat through which said plurality of terminals extend; and wherein the interior of said housing cap has a plurality of integral projections which project into said moat and surround said terminals.

17. The device of claim 1 wherein said plurality of semiconductor die include IGBT die.

18. The device of claim 1 wherein said thermally conductive substrate comprises a flat, relatively thick bottom plate of conductive material, a relatively thin layer of insulation material on the top of said bottom plate, and a relatively thin layer of conductive material disposed atop said layer of insulation material and having a given topological pattern over said layer of insulation material; and at least one flat conductive heat spreader plate connected over substantially its full bottom surface to an area of said relatively thin layer of conductive material and comprising a heat spreader plate; at least selected ones of said plurality of semiconductor die being soldered to the top surface of said heat spreader plate in closely spaced relation to one another and extending along a line which is generally along and through the center of said heat spreader, whereby heat can be efficiently conducted from said die to the full volume of said heat spreader plate.

19. The device of claim 18 wherein said relatively thick bottom plate and said heat spreader plate are aluminum.

20. The device of claim 19 wherein said heat spreader plate is a rectangular plate having a width which is close to the full width of said relatively thick bottom plate.

21. The device of claim 18 wherein said plurality of semiconductor die include IGBT die.

22. The device of claim 21 wherein said plurality of semiconductor die further include fast recovery diode die which are connected in parallel with respective ones of said IGBT die.

23. The device of claim 22 wherein said fast recovery diode die are spaced from one another and extend along a second line which is parallel to the line of said IGBT die.

24. The device of claim 23 wherein each of said IGBT die contains a gate resistor in series with its gate electrode; said gate resistors being integrated into each die respectively.

* * * * *